United States Patent [19]

Suzuki

[11] Patent Number: 5,253,211
[45] Date of Patent: Oct. 12, 1993

[54] SEMICONDUCTOR MEMORY DEVICE CAPABLE OF PERFORMING REFRESH OPERATION IN READING OR WRITING

[75] Inventor: Tomio Suzuki, Hyogo, Japan

[73] Assignee: Mitsubishi Denki Kabushiki Kaisha, Tokyo, Japan

[21] Appl. No.: 866,048

[22] Filed: Apr. 9, 1992

[30] Foreign Application Priority Data

Apr. 16, 1991 [JP] Japan .................................. 3-084245

[51] Int. Cl.⁵ ............................................ G11C 11/40
[52] U.S. Cl. ..................................... 365/222; 365/201
[58] Field of Search .............. 365/222, 189.01, 230.01, 365/201

[56] References Cited

U.S. PATENT DOCUMENTS 4,330,852 5/1982 Redwine ........................ 365/189.01
4,914,630, 4/1990 Fujishima et al. .

OTHER PUBLICATIONS

"A 1-Mbit CMOS DRAM with Fast Page Mode and Static Column Mode", by Shozo Saito et al., IEEE Journal of Solid-State Circuits, vol. SC-20, No. 5, Oct. 1985, pp. 903-908.

Primary Examiner—Terrell W. Fears
Attorney, Agent, or Firm—Lowe, Price, LeBlanc & Becker

[57] ABSTRACT

The semiconductor memory device according to the present invention includes a plurality of memory cells each for holding information charge arranged in a matrix of rows and columns, a plurality of bit line pairs, a plurality of word lines, a plurality of sense amplifiers grounded corresponding to the bit line pairs for amplifying a potential difference appearing between the bit lines of each bit line pair when information charge of each memory cell is read by a reading circuit, a plurality of holding circuits each provided corresponding to each of the bit line pairs and connected to the corresponding bit lines for holding the amplified potential difference of each bit line pair, a plurality of transistors for disconnecting the holding circuits from the bit line pairs with each holding circuit holding the potential difference of each corresponding bit line pair, a refresh device for refreshing a memory cell with a transistor being turned off, and an output device for outputting the potential difference held by one of the holding circuits corresponding to the selected column.

21 Claims, 14 Drawing Sheets

SEMICONDUCTOR MEMORY DEVICE CAPABLE OF PERFORMING REFRESH OPERATION IN READING OR WRITING

BACKGROUND OF THE INVENTION

1. Field of the Invention

The present invention relates generally to semiconductor memory devices, and more particularly, dynamic random access memories (hereinafter referred to as DRAM) capable of performing a refresh operation in a page mode.

2. Description of the Background Art

FIG. 13 is a block diagram showing one example of a DRAM structure.

The structure and operation of the DRAM will be described with reference to the drawing.

A memory cell array includes memory cells (Mil to Mkq) arranged in a matrix of rows and columns. Each memory cell comprises one n type transistor and one capacitor. A plurality of pairs of bit lines are provided to correspond to memory cells in a column direction. A plurality of word lines are provided to correspond to memory cells in a row direction. Each memory cell is provided at a cross-over point of a word line and one of the bit lines of a bit line pair. Sense amplifiers Sal to Saq receiving a signal $\phi sa$ are provided to the respective bit line pairs. Each bit line pair is connected to input/output lines IO and $\overline{IO}$ connected to a write circuit 3 and an output circuit 5. An n type transistor is connected to the bit lines of each pair of bit lines in between each sense amplifier and the input/output lines, a gate of which transistor is connected to a column decoder 12. A precharge potential Vb is applied to the other end of each of bit line pair through a transistor having a gate receiving a signal $\phi E$. Word lines WLi-WLk are connected to a row decoder 11. Row decoder 11 is connected to a row address buffer circuit 7 for holding an applied row address and a word line driving circuit 8 for driving a predetermined word line.

Operation of the DRAM will be briefly described in the following.

Selection of a memory cell is done for each cross-over point of one word line and one bit line selected by row decoder 11 and column decoder 12 based on row and column address data input to a terminal 1. An ordinary write to such a selected memory cell as described above is done by applying data (Din) input from a terminal 2 across bit lines of a predetermined bit line pair as a potential difference through input/output lines IO and $\overline{IO}$. The potential of the bit line connected to the selected memory cell is held by the capacitor. In a read operation, the potential held by the selected memory cell, the potential developing as the potential difference between the bit lines of the bit line pair connected to the memory cell, is amplified and the amplified potential is output as data (Dout) through input/output lines IO and $\overline{IO}$ by the selection of the output gate by column decoder 12.

The foregoing description is made on a common read and write operations. A read operation of a DRAM in a page mode will be described. The page mode reading is a reading operation carried out by externally and sequentially outputting a potential difference developed across bit lines of each bit line pair by a selected word line.

FIG. 14 is a waveform diagram of respective signals explaining the page mode reading operation.

For the purpose of simplicity, description will be given by assuming that "1" is written in all the memory cells as electric charge information.

Bit line equalize signal $\phi_E$ is brought down to a low level from a high level in response to the change of an $\overline{RAS}$ signal from a high level to a low level (at time $t_1$). In response to the change, row address buffer circuit 7 accepts a row address Xi input to terminal 1 to bring a word line WLi corresponding to the row address from a low level to a high level. The potential rise of word line WLi results in the read of the information charges held by memory cells Mil to Miq connected to the word line onto bit lines Bl to Bq. With the bit lines constituting bit line pairs having been precharged to a potential of $\frac{1}{2}$·Vcc by bit line equalize signal $\phi_E$, the potentials read from the memory cells develop predetermined potential difference between the bit lines constituting the bit line pairs. Activating the potential differences between the bit lines by sense amplifiers Sal to Saq results in amplification of respective potential differences between bit lines Bl and $\overline{Bl}$ to between Bq and $\overline{Bq}$.

Assuming that an address Ym is input to address input terminal 1 after the activation of the sense amplifiers, the address is accepted as a column address by column address buffer circuit 9. As a result, an input/output line IO gate control signal Ym output from column decoder 12 changes from a low level to a high level (at time t2). Consequently, information data of memory cell Mim, that is, the potential difference developed between the bit lines of Bm and $\overline{Bm}$ is transmitted to output circuit 5 through input/output lines IO and $\overline{IO}$.

Another column address (suppose Yn) input to address terminal 1 is internally accepted by bringing $\overline{CAS}$ from a low level to a high level (time t4). Output circuit 5 is disconnected from an output terminal 4 simultaneously with the acceptance of the column address, causing output terminal 4 to enter a high impedance state (HiZ). In this state, the internally accepted column address Yn controls column decoder 12 to bring IO gate control signal Yn from a low level to a high level. Subsequently, data of memory cell Min is transmitted to output circuit 5 through bit lines Bn and $\overline{Bn}$ and input/output lines IO and $\overline{IO}$ in this way. The data thus transmitted to output circuit 5 is externally output through output terminal 4 in the same manner as described above. Repetition of such operation sequentially reads data (Mil-Miq) of one row.

When reading of the data held in memory cells in one row or only required memory cells in one row is finished, $\overline{RAS}$ signal and $\overline{CAS}$ signal are brought from a low level to a high level (time t6). Then, word line WLi and sense amplifier drive signal $\phi sa$ are brought down from a high level to a low level. Then bit line equalize signal $\phi_E$ is brought from a low level to a high level to maintain the potential on all the bit lines at a precharge potential in order to be ready for reading of a subsequent row. A page mode reading operation for one row address signal is completed in this way.

A page mode writing operation will be described in the following. For the purpose of simplicity, description is made of a case where information "H" is written to all the memory cells with information "L" already written therein.

FIG. 15 is a waveform diagram of the respective signals illustrating the page mode writing operation.

$\overline{RAS}$ signal is changed from a high level to a low level (time t1), which is followed by a change of bit line equalize signal $\phi_E$ from a high level to a low level. In this state, row address buffer circuit 7 accepts a row address Xi input to address terminal 1 to operate word line driving circuit 8, thereby changing word line WLi corresponding to the input row address Xi from a low level to a high level. The potential rise of word line WLi results in reading of the data held by memory cells Mil-Miq onto respective bit lines Bl-Bq. Sense amplifier activation signal $\phi$sa is then changed from a low level to a high level to activate sense amplifiers Sal-Saq, thereby amplifying potential differences appearing between the bit lines.

Then an address, assumed to be Ym, input to address terminal 1 is accepted by column address buffer circuit 9 as a row address. Column decoder 12 changes IO gate control signal Ym from a low level to a high level based on the column address data (time t2). As a result, the data held by memory cell Mim is transmitted to output circuit 5 through bit lines Bm and $\overline{Bm}$ and input/output lines IO and $\overline{IO}$.

Data (Din) applied to data input terminal 2 is applied to input/output lines IO and $\overline{IO}$ through write circuit 3 by changing $\overline{CAS}$ signal from a high level to a low level (time t3). At the same time, IO gate control signal Ym corresponding to the column address Ym input to address terminal 1 again changes from a low level to a high level. The acceptance of the column address is made by accepting an input address as a column address at the time of the change of $\overline{CAS}$ signal from a high level to a low level. Thus, the data applied to data input terminal 2 is written in memory cell Mim through write circuit 3 and input/output lines IO and $\overline{IO}$. In this writing, signal $\overline{W}$ is maintained at a low level prior to the change of signal $\overline{CAS}$ from a high level to a low level.

Then, signal $\overline{CAS}$ is changed from a low level to a high level (time t4) after the completion of write of the externally applied data to memory cell Mim.

Repetition of such operation results in writing of external data to a memory cell (Mil-Miq) corresponding to an arbitrary column address.

At the completion of writing of data of one row or only the necessary data in one row, signals $\overline{RAS}$, $\overline{CAS}$ and $\overline{W}$ are changed from a low level to a high level (time t6). Then, word line WLi and sense amplifier driving signal $\phi$sa are changed from a high level to a low level. Furthermore, bit line equalize signal $\phi_E$ is changed from a low level to a high level to prepare for reading and writing of the subsequent row. Write of row address Xi in a page mode is completed in this way. The same operation enables the same page mode writing for another row address.

Brief description will be given to a refresh operation which should be performed in a cycle other than a reading operation or a writing operation.

Like a reading operation, $\overline{RAS}$ signal is first changed from a high level to a low level, whereby row address buffer circuit 7 accepts a row address input to address terminal 1. Word line WLi corresponding to the accepted row address is changed from a low level to a high level by activating word line driving circuit 8. Such potential rise of word line WLi results in the reading of the data held by memory cells Mil-Miq onto bit lines Bl-Bq, respectively. Then sense amplifier activation signal $\phi$sa is changed from a low level to a high level to activate sense amplifiers Sal-Saq, thereby amplifying potential differences appearing between bit line pairs of Bl and $\overline{Bl}$ to Bq and $\overline{Bq}$. High level or low level data corresponding to the previously written data are re-written in memory cells Mil-Miq connected to word line WLi based on such amplified potential differences. $\overline{RAS}$ is changed from a low level to a high level at the completion of the re-write of data. Then, word line WLi and sense amplifier driving signal $\phi$sa are changed from a high level to a low level. Bit line equalize signal $\phi_E$ is changed from a low level to a high level to prepare for a refresh operation of another row. Memory cell data in one row of row address Xi is refreshed in this way.

Repetition of the operation for each row in the manner as described above results in refreshing of the whole memory cells. In a case of a DRAM comprising a memory cell array of p rows × q columns, for example, p time repetition of the refresh operations completes the refreshing of the entire memory cell array.

As described above, a memory cell of a DRAM comprising one transistor and one capacitor has electric charges stored therein being constantly lost as a small amount of leakage current. It is therefore necessary to perform such a refresh operation as described above at predetermined intervals to constantly maintain the amount of electric charges stored in the memory cell at a level above a fixed value. A refresh operation results in electric charges held in a memory cell being once read onto a bit line connected to the memory cell. A refresh operation therefore can not be done in a case where a potential appearing between bit lines is successively output or written in a page mode operation and the like. For a conventional DRAM, a refresh operation should be performed by interrupting a reading or a writing operation at predetermined intervals.

SUMMARY OF THE INVENTION

An object of the present invention is to perform an efficient refresh operation in a semiconductor memory device.

Another object of the present invention is to perform a refresh operation in the course of a reading operation or a writing operation.

A further object of the present invention is to enable a semiconductor memory device to perform a refresh operation even in the course of a reading operation or a writing operation in a page mode.

In order to achieve the above-described objects, the semiconductor memory device according to the present invention includes a plurality of memory cells arranged in a matrix of rows and columns, each for storing information electric charges, a plurality of bit line pairs each connected to memory cells of a corresponding row, a plurality of word lines each provided corresponding to each of memory cell columns and crossing with the pairs of the bit lines and connected with the corresponding memory cells, reading means for selecting one of the word lines to read the information charge in each memory cell connected to the selected word line onto one of the bit lines of each bit line pair, a plurality of sense amplifiers each arranged corresponding to each bit line pair for amplifying a potential difference appearing between the bit lines of each bit line pair when the reading means reads the information charge of each memory cell, a plurality of holding means each provided corresponding to each bit line pair and to be connected with the corresponding bit line to hold the amplified potential difference of each bit line pair, a plurality of disconnecting means for disconnecting the holding means from the bit line pairs with each holding means holding the potential difference of each corresponding bit line pair, refresh means for refreshing a memory cell with the disconnecting means being activated, and outputting means for outputting a potential difference held by one holding means corresponding to a selected column.

The semiconductor memory device structured as described above wherein a refresh operation of a memory cell is performed with the holding means holding the potential difference of each bit line pair, enables an effective use thereof without interrupting a reading operation or the like for refreshing.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
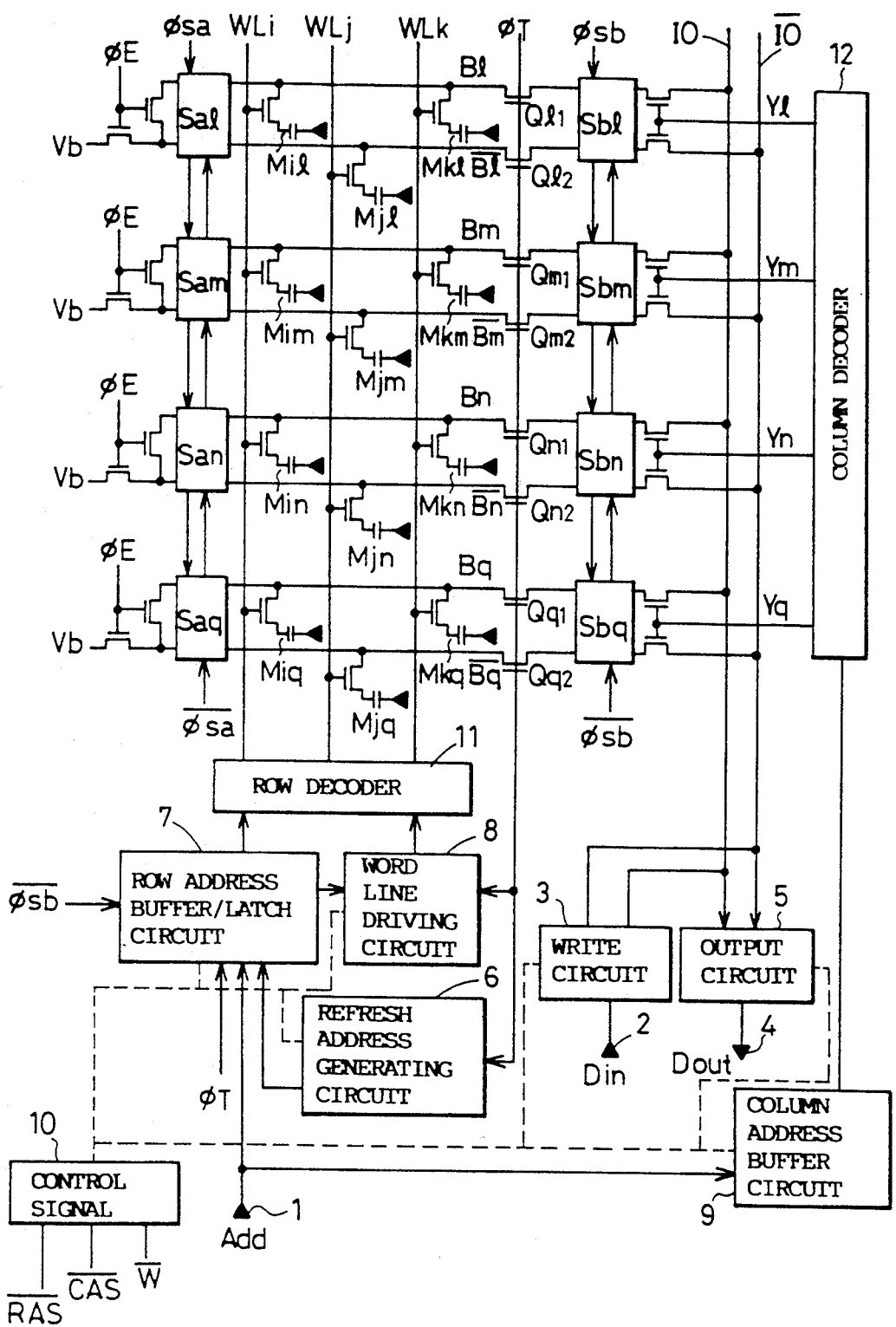
FIG. 1 is a block diagram showing a specific structure of a DRAM according to one embodiment of the present invention.

FIG. 1 is a block diagram showing the structure of a DRAM according to one embodiment of the present invention.

Figure 13:
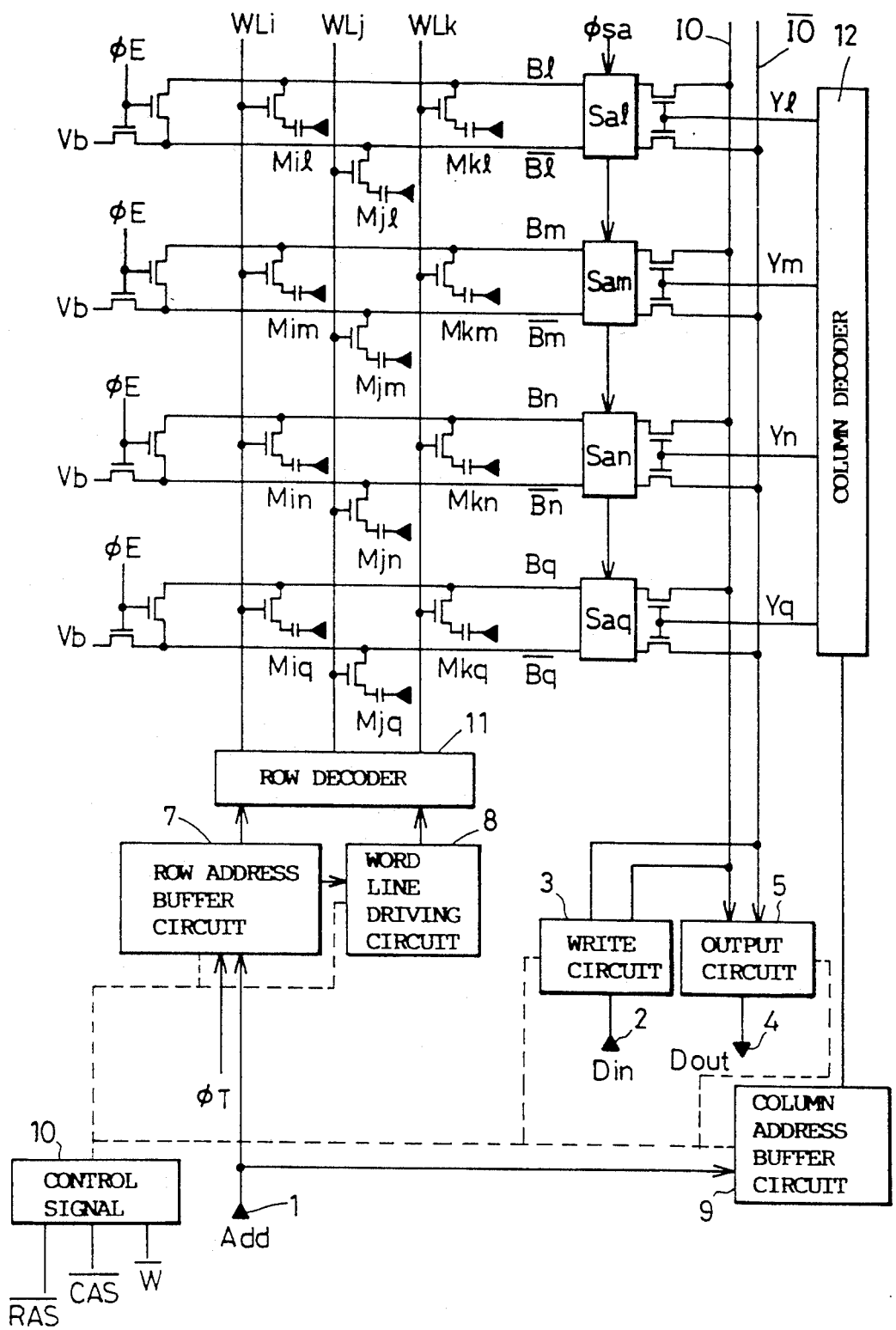
FIG. 13 is a block diagram showing a specific structure of a conventional DRAM.
Figure 14:
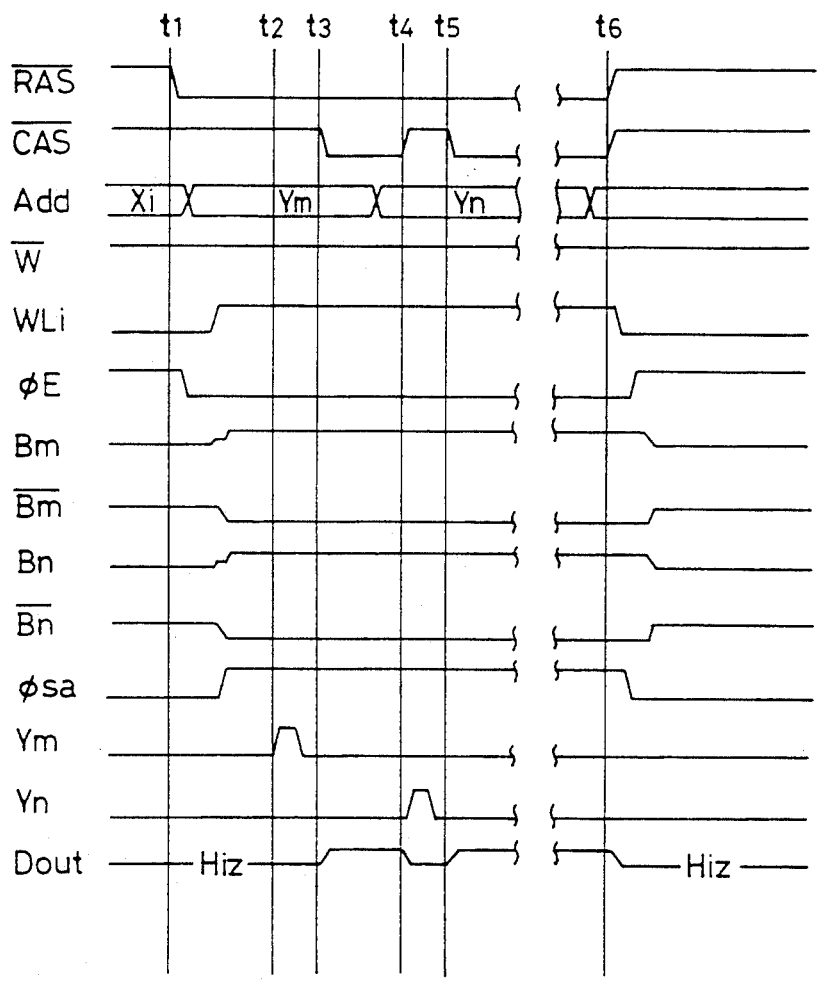
FIG. 14 is a waveform diagram of control signals illustrating a reading operation of a conventional DRAM in a page mode.
Figure 15:
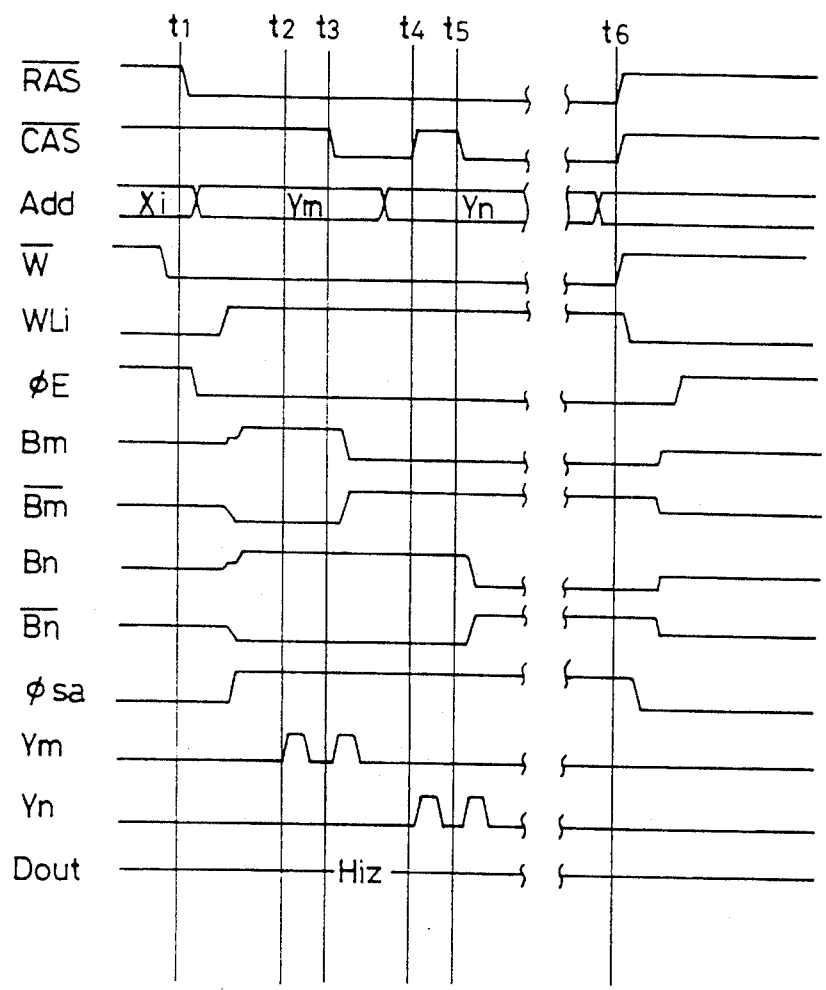
FIG. 15 is a waveform diagram of control signals illustrating a writing operation of a conventional DRAM in a page mode.

Description will be made in the following mainly of the points different from those of the block diagram of FIG. 13 shown as prior art.

n type transistors $Ql_1$ and $Ql_2$ to $Qq_1$ and $Qq_2$ are respectively provided on the bit lines of the bit line pairs at a column decoder 12 side. Apart from ordinary sense amplifiers Sal-Saq, sense amplifiers Sbl-Sbq for holding data are provided between said transistors and transistors for receiving IO gate control signals. Each of the sense amplifiers receives drive signals $\phi sb$ and $\overline{\phi sb}$. The gates of transistors $Ql_1$ and $Ql_2$ to $Qq_1$ and $Qq_2$ receive a control signal $\phi_T$ which signal is also applied to a word line driving circuit 8 and an additionally provided refresh address generation circuit 6. In this embodiment, the conventional row address buffer circuit 7 is replaced by a row address buffer/latch circuit 7 having a latch function which is supplied with a control signal $\overline{\phi sb}$.

Ordinary reading and writing operations are basically the same as those of the prior art DRAM shown in FIG. 13. More specifically, in the reading and the writing operations, control signal $\phi_T$ is maintained at a high level at all times, sense amplifiers Sbl-Sbq are not activated, and potential differences appearing between the bit lines are amplified by sense amplifiers Sal-Saq and externally output through input/output lines IO and externally applied write data is written in a desired memory cell through input/output lines IO and $\overline{IO}$ and a predetermined bit line pair.

The present invention is greatly different from the prior art in a page mode operation and a refresh operation of which the detailed description will be given in the following.

Figure 2:
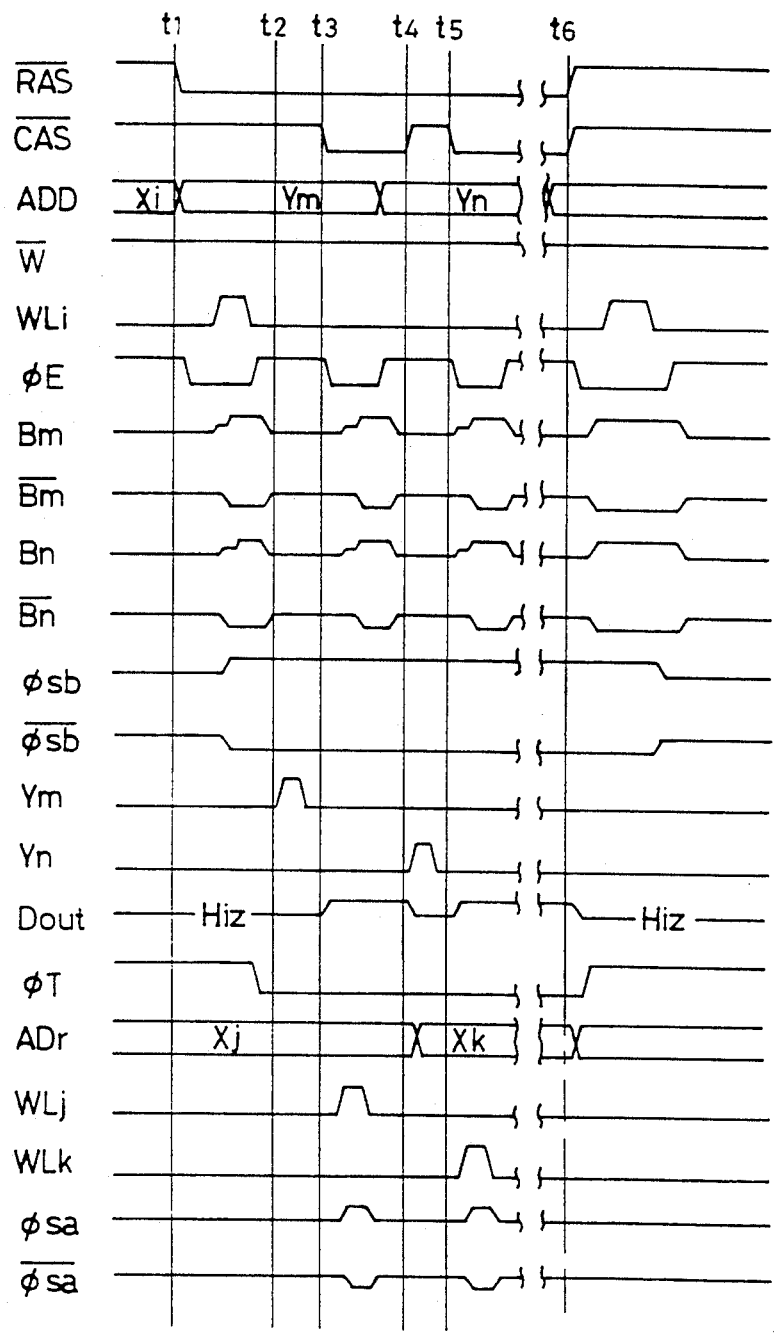
FIG. 2 is a waveform diagram of control signals illustrating a refresh operation to be performed in parallel with a reading operation of the DRAM according to one embodiment of the present invention in a page mode.

First, a refresh operation carried out in parallel with a reading operation in a page mode will be described. FIG. 2 is a waveform diagram of the respective control signals in such an operation.

An $\overline{RAS}$ signal changes from a high level to a low level (at time t1), thereby changing a bit line equalize signal $\phi_E$ from a high level to a low level. At this time, a row address buffer/latch circuit accepts a row address Xi input to an address terminal 1. A word line WLi corresponding to the accepted row address Xi is changed from a low level to a high level. As a result, the data stored in memory cells Mil-Miq are read onto bit lines Bl-Bq. Sense amplifier activation signals $\phi sb$ and $\overline{\phi sb}$ are changed to a high level and a low level, respectively, thereby activating sense amplifiers Sbl-Sbq to amplify potential differences appearing between the bit lines of the bit line pairs, which operation is the same as that in the prior art. At this time, the address accepted as a row address is held by row address buffer/latch circuit 7 in response to the change of the signal $\overline{\phi sb}$. The reason why the address signal is held is that in the case of performing a refresh operation during a reading operation, it is necessary to select the row address signal to rewrite the data held in the reading operation into the original memory cell.

Then, word line WLi is changed from a high level to a low level, while control signal $\phi_T$ is changed from a high level to a low level, thereby disconnecting the bit line pairs from sense amplifiers Sbl-Sbq. Then, bit line equalize signal $\phi_E$ is brought to a high level from a low level to maintain each bit line constituting the bit line pairs at a precharge potential of $\frac{1}{2}\cdot V_{cc}$.

Then, assuming that the column address input to address terminal 1 is Ym, Ym is accepted by a column address buffer circuit 9 as a column address. As a result, column decoder 12 changes the level of IO gate control signal Ym from a low level to a high level (time t2), whereby the potential difference held by sense amplifier Sbm is transmitted to an output circuit 5 through input-/output lines IO and $\overline{IO}$.

The data of output circuit is externally output through an output terminal 4 by changing the signal $\overline{CAS}$ from a high level to a low level (time t3). The data in the memory cell selected by row address Xi and column address Ym is read out in this way.

Then, by changing the signal $\overline{CAS}$ from a low level to a high level (time t4), another column address (assumed to be Yn) input to address terminal 1 is similarity accepted by column address buffer circuit 9. At the same time, output circuit 5 and output terminal 4 are electrically disconnected from each other to cause output terminal 4 to have a high impedance (HiZ). IO gate control signal Yn corresponding to the column address Yn changes from a low level to a high level and the data held by sense amplifier Sbn is similarly transmitted to output circuit 5 through input/output lines IO and $\overline{IO}$. Thus, the data held by sense amplifiers Sbl-Sbq are externally output through output terminal 4 in turn, resulting in a sequential read of the data in memory cells Mil-Miq in one row.

Signals $\overline{RAS}$ and $\overline{CAS}$ are changed from a low level to a high level (time t6) at the completion of the data reading of all the memory cells or necessary memory cells in one row. Then, bit line equalize signal $\phi_E$ is changed from a high level to a low level, which is followed by the change of the signal $\phi_T$ from a low level to a high level. Word line driving circuit 8 changes the potential on word line WL from a low level to a high level based on row address Xi held by row address buffer/latch circuit 7. As a result, the data held by sense amplifiers Sbl-Sbq are re-written in memory cells Mil-Miq. Then, word line WLi is changed from a high level to a low level and sense amplifier drive signals $\phi$sb and $\overline{\phi sb}$ are set to an intermediate potential. In addition, bit line equalize signal $\phi_E$ is changed from a low level to a high level to prepare for a subsequent read of another row address. Reading of row address Xi in a page mode finishes in this way. Repetition of such an operation as described above enables read of other row addresses in a page mode.

According to the present invention, refresh can be done in a page mode reading operation, of which refreshing detailed description will be given later.

A writing operation in a page mode will be described in the following. For the purpose of simplicity, description will be given assuming that "H" information will be written in all the memory cells with "L" charge information already written therein.

Figure 3:
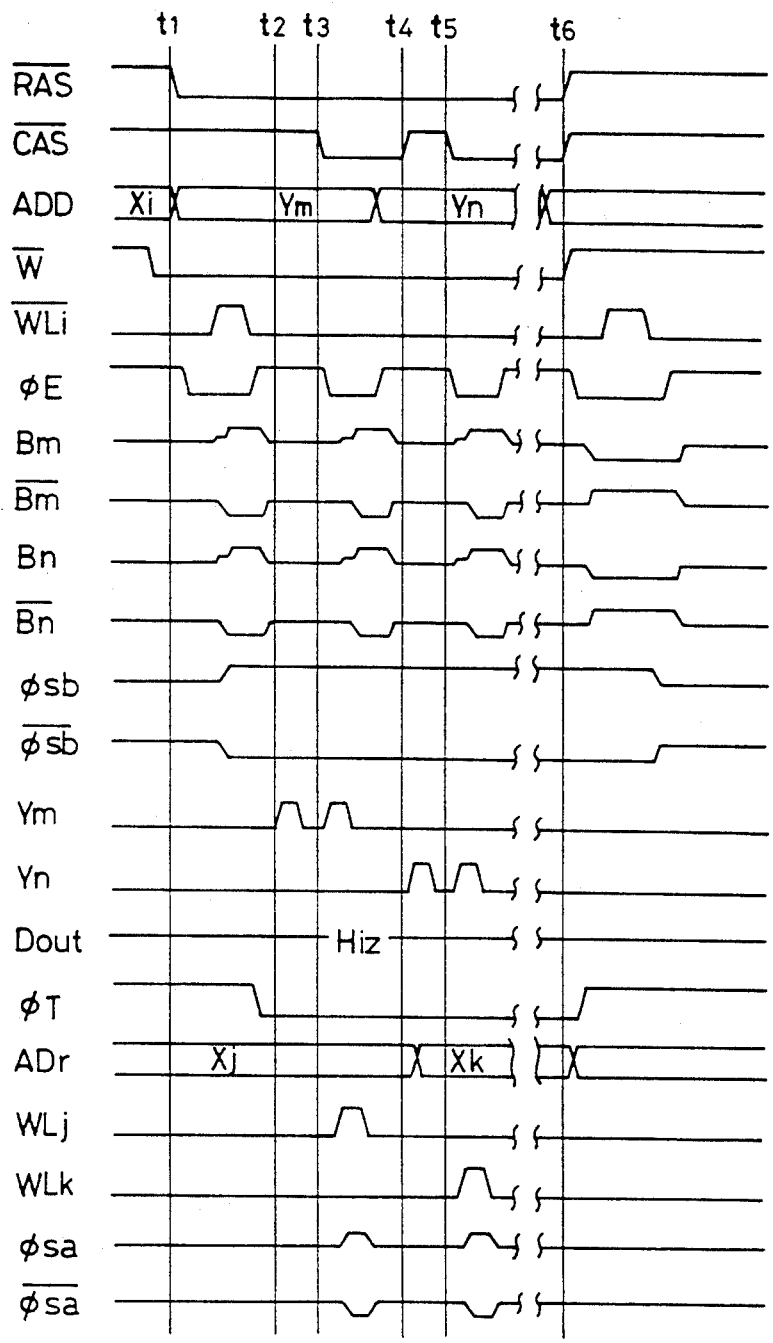
FIG. 3 is a waveform diagram of control signals illustrating a refresh operation to be performed in parallel with a writing operation of the DRAM according to one embodiment of the present invention in a page mode.

FIG. 3 is a waveform diagram of the respective control signals illustrating a writing operation in the page mode.

$\overline{RAS}$ signal is changed from a high level to a low level (time t1), while bit line equalize signal $\phi_E$ is changed from a high level to a low level. At the same time, row address Xi input to address terminal 1 is accepted by low address buffer/latch circuit 7. Word line WLi corresponding to the accepted row address Xi is changed from a low level to a high level, thereby reading the data stored in memory cells Mil-Miq onto bit lines Bl-Bq. Then, sense amplifier activation signals $\phi$sb and $\overline{\phi Sb}$ are changed from a high level to a low level to activate sense amplifiers Sbl-Sbq, thereby amplifying the potential differences appearing between bit lines Bl-Bq and bit lines $\overline{Bl}$-$\overline{Bq}$, respectively.

Then, the bit line pairs are disconnected from sense amplifiers Sbl-Sbq by changing word line WLi and control signal $\phi_T$ from a high level to a low level. Thereafter, bit line equalize signal $\phi_E$ is changed from a low level to a high level to maintain the potentials on the respective bit lines constituting the bit line pairs at a precharge potential.

Then, assuming that a column address input to address terminal 1 is Ym, the address is accepted by column address buffer circuit 9 as a column address. As a result, column decoder 12 changes the corresponding IO gate control signal Ym from a low level to a high level (time t2), whereby the data of the potential difference held by sense amplifier Sbm is transmitted to output circuit 5 through input/output lines IO and $\overline{IO}$.

Then, data (Din) applied to a data input terminal 2 is transmitted to input/output lines IO and $\overline{IO}$ through a write circuit 3 by changing the level of $\overline{CAS}$ signal from a high level to a low level (time t3). At the same time, IO gate control signal Ym corresponding to column address Ym is brought to a high level from a low level. The input address at the change of the signal $\overline{CAS}$ from a high level to a low level is internally accepted as a column address. Thus, the data applied to data input terminal 2 is written in sense amplifier Sbm through write circuit 3 and input/output lines IO and $\overline{IO}$. More specifically, sense amplifier Sb amplifies and maintains each potential difference appearing between the respective bit lines based on the applied data. In a writing operation, control signal $\overline{W}$ is previously maintained at a low level before changing signal $\overline{CAS}$ from a high level to a low level.

Then, after finishing the write of the data to the sense amplifier, signal $\overline{CAS}$ is changed from a low level to a high level (time t4).

Repetition of the above-described operation results in sequential write of externally applied data to a sense amplifier corresponding to an arbitrary column address.

Signals $\overline{RAS}$, $\overline{CAS}$ and $\overline{W}$ are changed from a low level to a high level (time t6) after finishing the write of all the data or necessary data in one row to the sense amplifier. Then, bit line equalize signal $\phi_E$ is brought down to a low level from a high level, while control signal $\phi_T$ is brought to a high level from a low level. Then, word line WLi is changed from a low level to a high level based on row address Xi held by row address buffer/latch circuit 7 to re-write the data held by sense amplifiers Sbl-Sbq into memory cells Mil-Miq.

Word line WLi is changed from a high level to a low level and sense amplifier driving signals $\phi$sb and $\overline{\phi sb}$ are set to an intermediate potential. Then, bit line equalize signal $\phi_E$ is brought to a high level from a low level to prepare for a read of another row. The foregoing operation completes the write to row address Xi in the page mode. The same writing operation in the page mode can be performed for other row addresses in the above-described manner. According to the present invention, a refresh operation can be performed during the above-described writing operation in the page mode, a more detailed description of which refresh operation will be made in the following.

A refresh operation will be described.

A refresh operation is performed when bit lines Bl and $\overline{Bl}$-Bq and $\overline{Bq}$ are electrically disconnected from sense amplifiers Sbl-Sbq, that is, when control signal $\phi_T$ is at a low level. This enables a refresh operation to be performed in parallel with a reading operation or a writing operation.

FIGS. 2 and 3 are waveform diagrams of signals related to a refresh operation performed when control signal $\phi_T$ is at a low level.

Signal $\overline{CAS}$ changes from a high level to a low level (time t3), whereby word line driving circuit 8 changes the level of word line WLj corresponding to row address (assumed to be Xj) output by refresh address generation circuit 6 from a low level to a high level. Then, drive signals $\phi sa$ and $\overline{\phi sa}$ applied to sense amplifiers Sal-Saq are changed from a high level to a low level. Thus, the activated sense amplifiers Sal-Saq once read out the data written in memory cells Mjl-Mjq connected to the word line WLj onto bit lines Bl-$\overline{Bq}$. The read data are amplified and re-written into the respective memory cells, thereby refreshing the data in one row of row address Xj. The refresh address signal is generated as a result of the change of control signal $\phi_T$ from a high level to a low level applied to refresh address generation circuit 6.

Then, by using the change of the signal $\overline{CAS}$ as a trigger, signal $\overline{CAS}$ is brought down to a low level from a high level (time t5). Word line WLk corresponding to the row address (assumed to be Xk) output from refresh address generation circuit 6 is brought to a high level from a low level by word line driving circuit 8, thereby changing the levels of sense amplifier drive signals $\phi sa$ and $\overline{\phi sa}$ to a high level and a low level, respectively. The data similarly written in memory cells Mkl-Mkq connected to word line WLk are read onto bit lines Bl-Bq in this way and amplified, which amplified data is re-written in each memory cell. The foregoing operation is a refresh of the data in one row of row address Xk.

As described in the foregoing, repetition of the above-described operation enables parallel refreshing of the respective rows while carrying out a reading operation or a writing operation in the page mode. A memory cell array of p rows by q columns requires p times of repetitions of the above-described operation to complete the refresh of the entire memory cell array.

An interval at which a refresh address is generated in a refresh operation is determined by using a column selection by a column decoder in a page mode as a trigger, which refresh address is generated by refresh address generation circuit 6. In general, an interval at which a column address is selected by a column decoder is about 50 ns, while an interval of a refresh as an ordinary refresh cycle is about 16 $\mu s$ or less. Therefore, for matching a refresh address generation timing with the cycle, it is possible to generate a refresh address at appropriate intervals in response to the output of a ring oscillator or the like provided in refresh address generation circuit 6 without using, as a trigger, a column selection by a column decoder, that is, a change of $\overline{CAS}$ from a high level to a low level.

Figure 4:
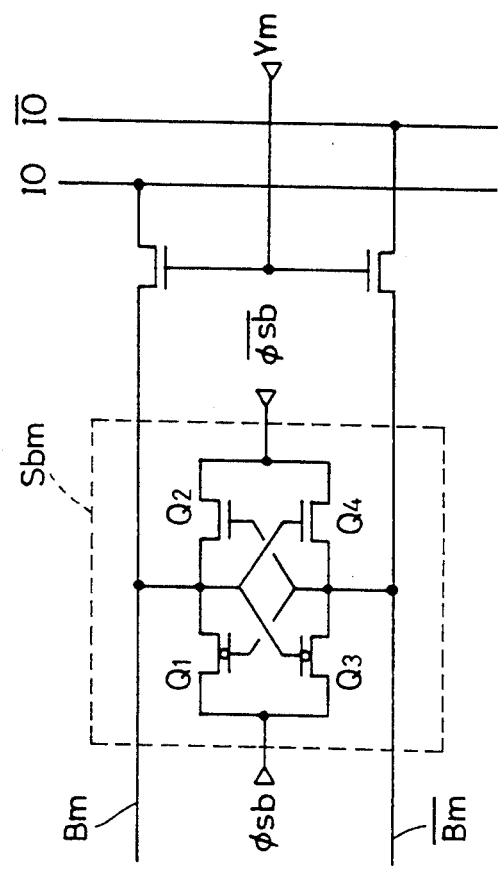
FIG. 4 is a circuit diagram showing a specific structure of the sense amplifier Sbm shown in FIG. 1.

FIG. 4 is a circuit diagram showing a specific structure of sense amplifier Sbm according to the present invention.

In the drawing, a bit line Bm is connected to one of the source and the drain of a p type transistor $Q_1$ and an n type transistor $Q_2$. A bit line $\overline{Bm}$ is connected to one of the source and the drain of a p type transistor $Q_3$ and an n type transistor $Q_4$. Bit line Bm is connected to the gates of transistors $Q_3$ and $Q_4$, while bit line $\overline{Bm}$ is connected to the gates of transistors $Q_1$ and $Q_2$. The other of the source and drain of transistor Q1 and transistor $Q_3$ is connected to a sense amplifier activation signal $\phi sb$, while the other of the source and drain of transistor $Q_2$ and the transistor $Q_4$ is connected to a sense amplifier activation signal $\overline{\phi sb}$. With sense amplifier Sbm structured as described above, a potential difference appearing between bit lines Bm and $\overline{Bm}$ is amplified to be held by sense amplifier Sbm as a result of the change of driving signal $\phi sb$ from a low level to a high level and driving signal $\overline{\phi sb}$ from a high level to a low level.

Figure 5:
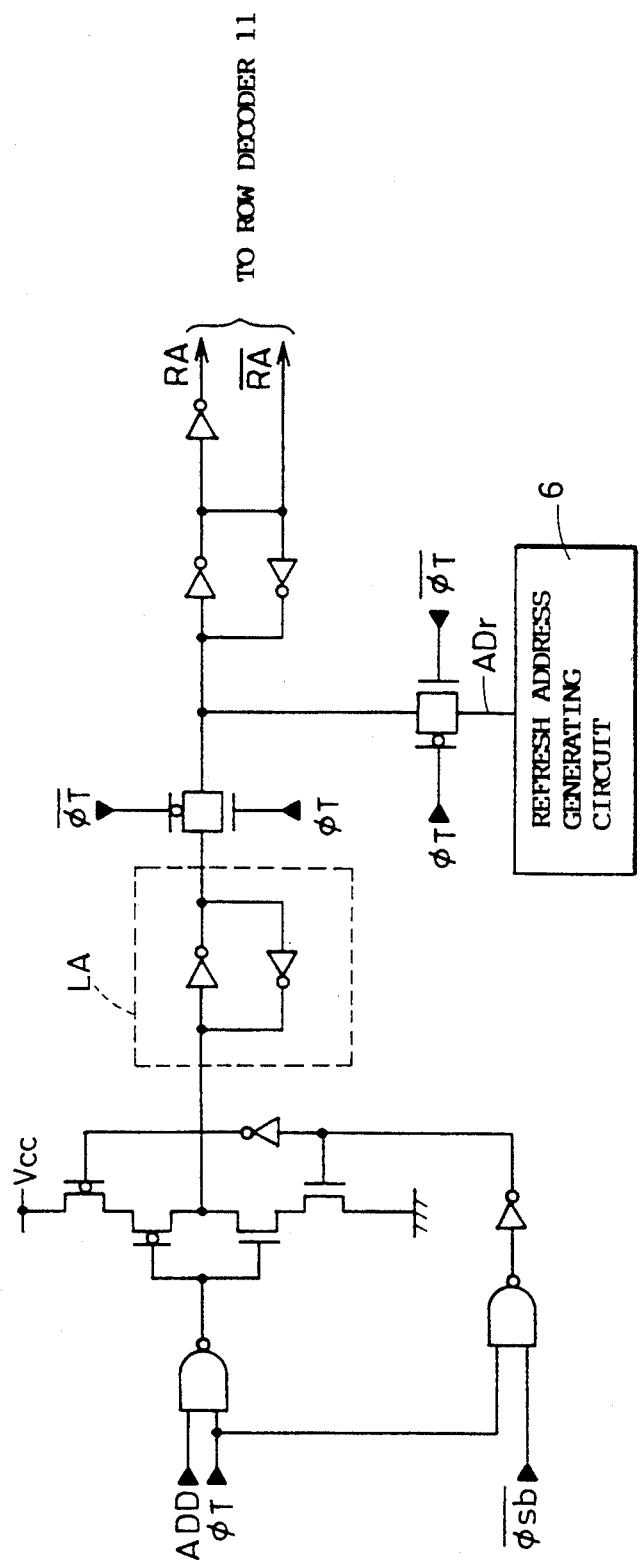
FIG. 5 is a diagram showing a specific structure of the row address buffer/latch circuit shown in FIG. 1.
Figure 6:
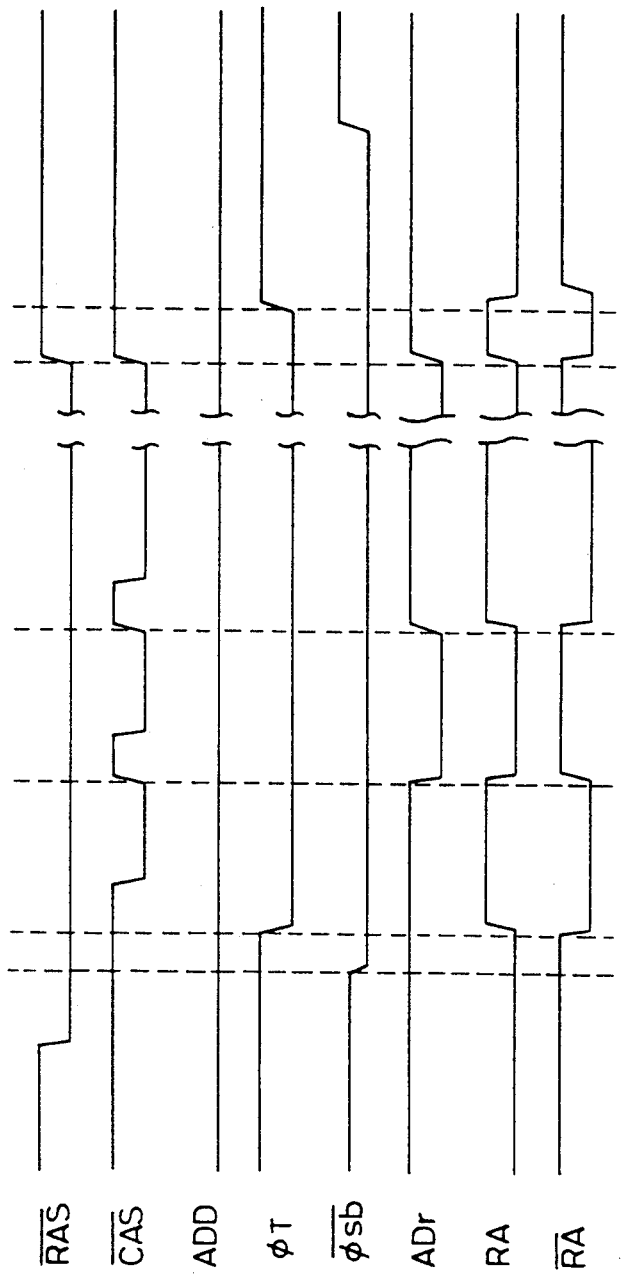
FIG. 6 is a waveform diagram of control signals illustrating the operation of the row address buffer/latch circuit of FIG. 5.

FIG. 5 is a circuit diagram specifically showing the structure of row address buffer/latch circuit 7 of FIG. 1 and FIG. 6 is a waveform diagram of the respective control signals illustrating the operation of the row address buffer/latch circuit.

In the drawings, an address signal ADD input to address terminal 1 is held by a latch portion LA shown by the dotted line, while the signal is output to row decoder 11 as row address signals RA and $\overline{RA}$ in an ordinary reading or writing operation.

When a refresh operation is carried out in parallel with a reading or writing operation, an address signal input to address terminal 1 is not output but an address signal ADr generated by refresh address generation circuit 6 is output to row decoder 11 as row address signals RA and $\overline{RA}$ in response to a change of control signal $\phi_T$ from a high level to a low level. At the end of the refresh operation, the address signal ADr from refresh address generation circuit 6 is not output but an external address signal latched by the latch portion LA is output to row decoder 11 as row address signals RA and $\overline{RA}$.

Figure 7:
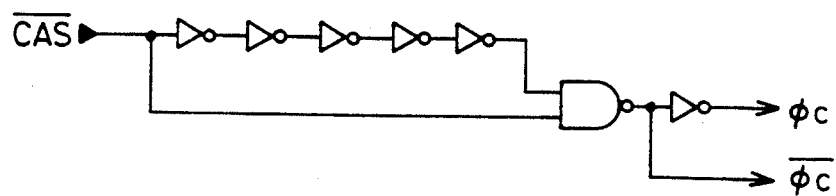
FIG. 7 is a circuit diagram showing a specific structure of a part of the refresh address generation circuit shown in FIG. 1.
Figure 8:
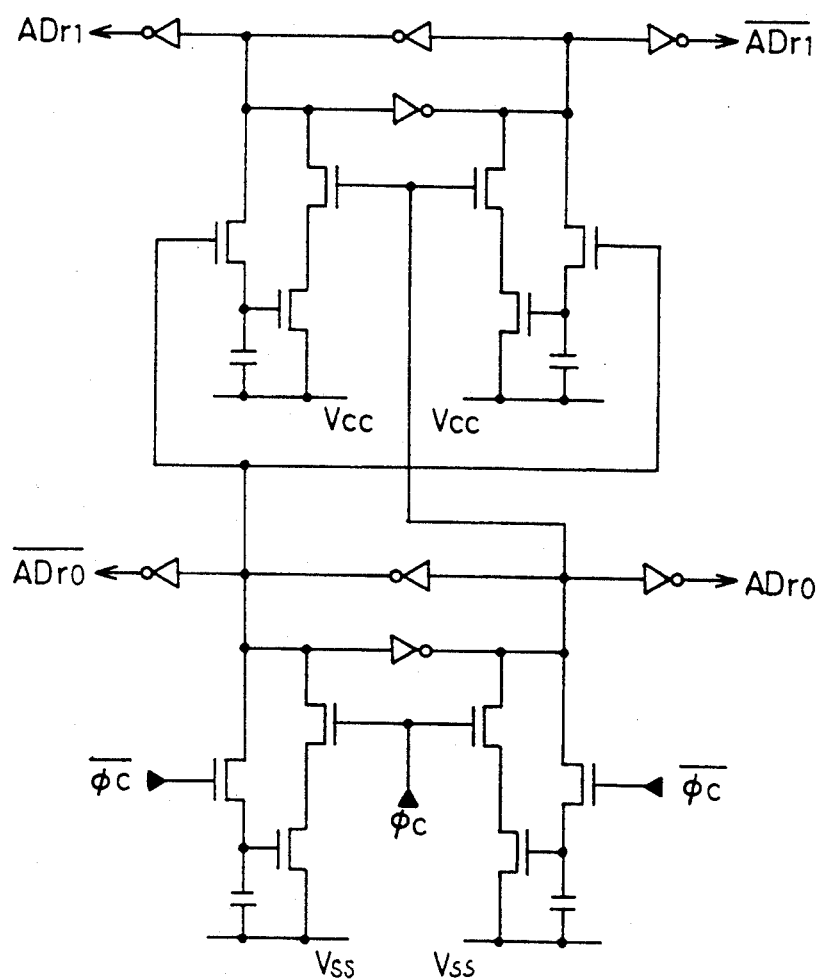
FIG. 8 is a circuit diagram showing a specific structure of the other part of the refresh address generation circuit shown in FIG. 1.
Figure 9:
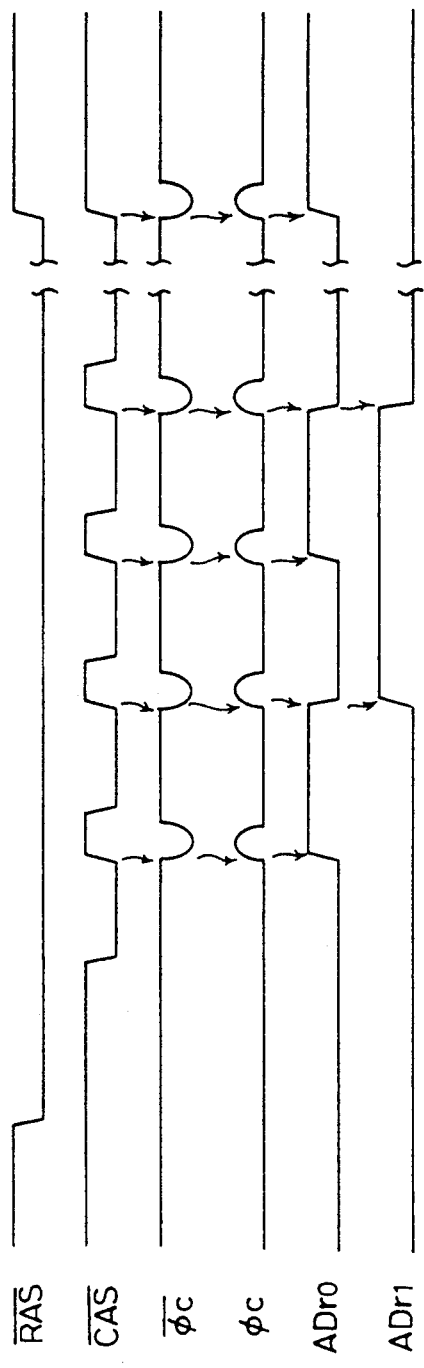
FIG. 9 is a waveform diagram of control signals illustrating the operation of the refresh address generation circuit shown in FIGS. 7 and 8.

FIGS. 7 and 8 are circuit diagrams specifically showing the structure of refresh address generation circuit 6 shown in FIG. 1 and FIG. 9 is a waveform diagram of the control signals illustrating the circuit operation.

Although the drawings show the circuit structure for 2-bit data of $ADr_0$ and $ADr_1$ and the generation of an address, the circuit is in practice structured to generate row address data of a number of bits required for defining an address of a DRAM.

In the drawings, control signals $\phi c$ and $\overline{\phi c}$ delayed by a predetermined time period are generated in response to an input of signal $\overline{CAS}$. In response to the generation of the control signals, address signals $ADr_0$ and $ADr_1$ are generated and output to row address buffer/latch 7.

Figure 10:
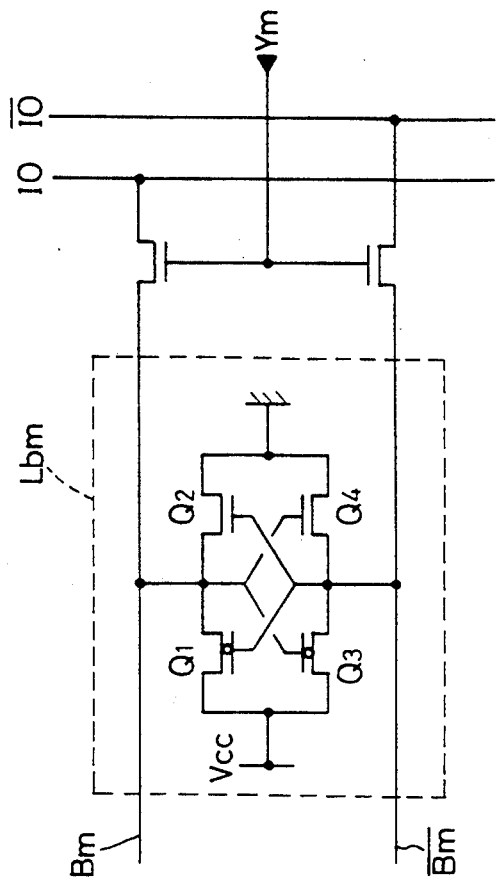
FIG. 10 is a circuit diagram showing a specific structure of a latch circuit Lbm used in place of the sense amplifier Sbm of FIG. 1 according to another embodiment of the present invention.

FIG. 10 is a diagram showing a specific structure of a latch circuit replacing sense amplifiers Sbl-Sbq shown in FIG. 1, according to another embodiment of the present invention.

With reference to the drawing, the basic structure is the same as that of the sense amplifier Sbm shown in FIG. 4 with a difference in that a power source potential Vcc and a ground potential replace sense amplifier drive signals $\phi sb$ and $\overline{\phi sb}$ of FIG. 4. Unlike the previous embodiment, with no drive signal being applied in this case, a bit line can not be driven in response to a potential difference appearing between bit lines Bm and $\overline{Bm}$ and the potential difference is simply maintained. It is therefore necessary to drive a bit line in response to a potential difference by using sense amplifiers Sal-Saq shown in FIG. 1.

Figure 11:
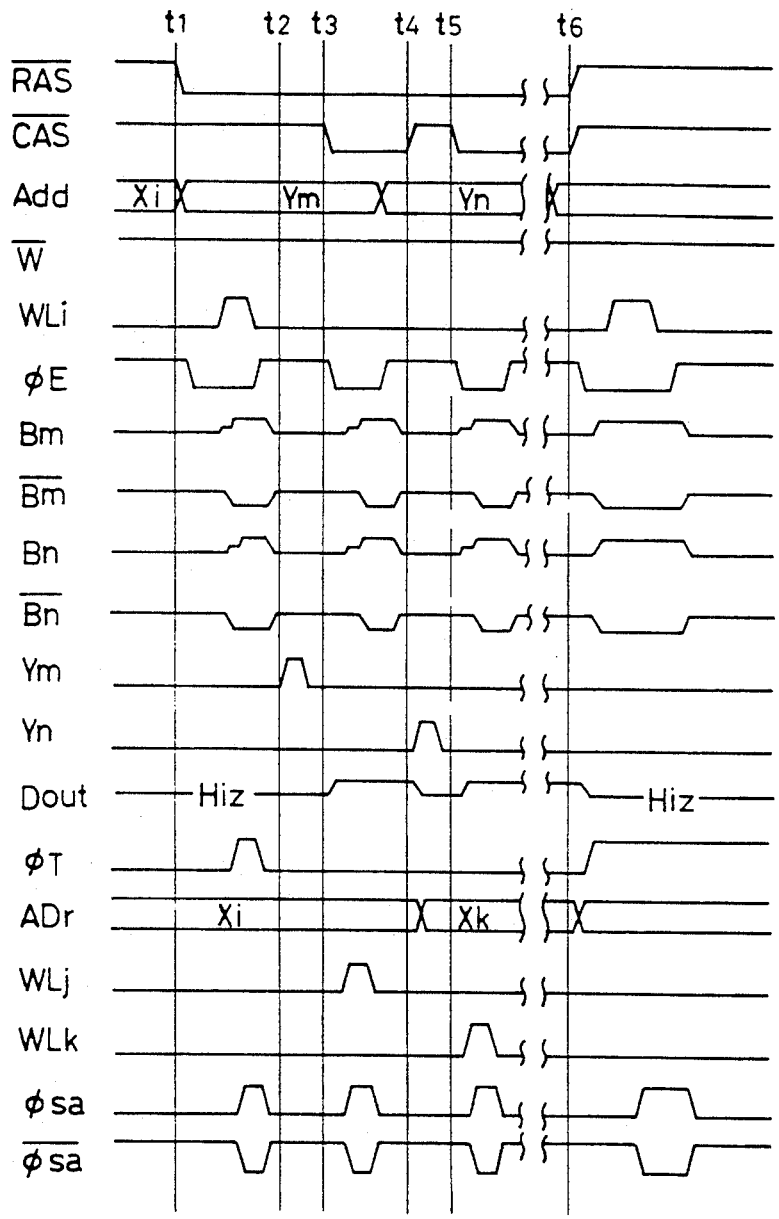
FIG. 11 is a waveform diagram of control signals illustrating the contents of the refresh operation to be performed in parallel with the reading operation in a page mode according to another embodiment of the present invention.
Figure 12:
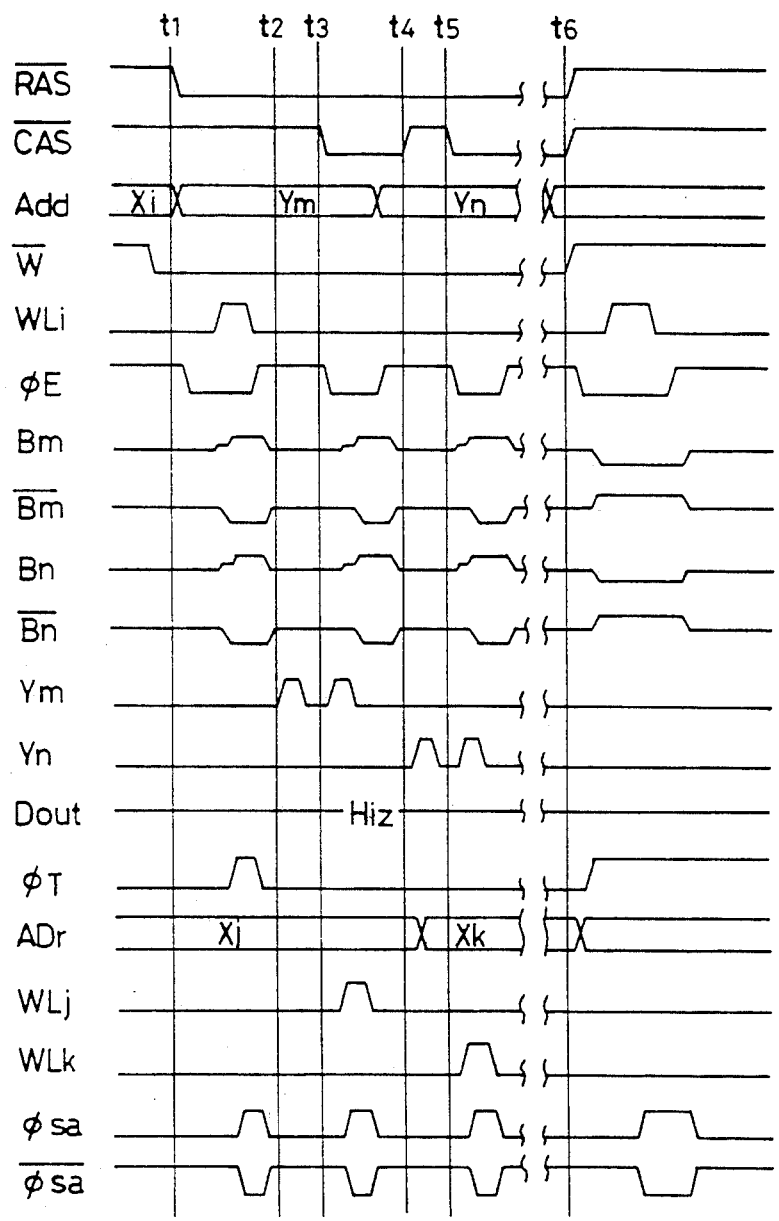
FIG. 12 is a waveform diagram of control signals illustrating a refresh operation to be performed in parallel with a writing operation in a page mode according to another embodiment of the present invention.

FIG. 11 is a waveform diagram of various control signals illustrating a refresh operation carried out in parallel with a reading operation in the page mode according to the present embodiment and FIG. 12 is a waveform diagram showing various control signals illustrating a refresh operation similarily carried out in parallel with a writing operation in the page mode according to the present embodiment.

Operation of the present embodiment will be described in the following mainly on the points different from those of the previous embodiment.

Data of a memory cell read in response to a rise of word line WLi between time t1 and t2 is transferred to latch circuits Lbl-Lbq in response to a rise of control signal $\phi_T$. At the same time, sense amplifier drive signals $\phi$sa and $\overline{\phi\text{sa}}$ for driving sense amplifiers Sal-Saq are also changed to drive the sense amplifiers. Then, control signal $\phi_T$ is changed from a high level to a low level to disconnect the latch circuit portion from a bit line. Then, the word line is brought to a high level to change sense amplifier driving signals $\phi$sa and $\overline{\phi\text{sa}}$, thereby sequentially selecting predetermined word lines for refreshing, which operation is the same as that of the previous embodiment. Sense amplifier driving signals $\phi$sa and $\overline{\phi\text{sa}}$ are changed also in an operation for returning the data held by the latch circuit to a predetermined memory cell (after time t6) after finishing the refresh operation. More specifically, writing data in a memory cell is performed after driving the bit lines based on the data held by each latch circuit by driving sense amplifiers Sal-Saq. The reason for this is that driving the sense amplifiers is preferable in order to reliably write the data held by the latch circuits in desired memory cells at a high speed because the latch circuits simply hold the potential differences appearing between the bit lines.

As described in the foregoing, it is possible to perform a refresh operation in parallel with a reading operation or a writing operation in the page mode by providing latch circuits for the respective bit line pairs.

While the above-described embodiments are adapted to a reading operation and a writing operation in the page mode, a refresh operation can be performed also in parallel with ordinary reading and writing operations.

As described in the foregoing, the present invention enables a memory cell to be refreshed with the holding means maintaining a potential difference between bit lines of each bit line pair, thereby allowing information charges of the memory cells to be output without interrupting a reading operation or the like for a refresh operation, resulting in an improvement in handling facility of the device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a plurality of memory cells each for storing information charge arranged in a matrix of rows and columns,
    a plurality of bit line pairs each provided corresponding to each of the rows of said memory cells and connected to the memory cells of the corresponding row,
    a plurality of word lines each provided corresponding to each of the columns of said memory cells in a direction crossing said bit line pairs and connected to the corresponding memory cells,
    reading means for selecting one of said word lines and reading the information charges of each memory cell connected to the selected word line onto one of the bit lines of each of said bit line pairs,
    a plurality of sense amplifiers each provided corresponding to each of said bit line pairs for amplifying a potential difference appearing between the bit lines of each of said bit line pairs when said reading means reads the information charge of each memory cell,
    a plurality of holding means each provided corresponding to each of bit line pairs, to be connected to the corresponding bit line to hold said amplified potential difference between each of the bit lines of the bit line pair,
    a plurality of disconnecting means for disconnecting said holding means from said bit line pairs with said holding means each holding each potential difference between the bit lines of the corresponding bit line pair,
    refreshing means for refreshing said memory cells with said disconnecting means being activated, and
    outputting means for outputting the potential difference held by one of said holding means corresponding to a selected column.

2. The semiconductor memory device according to claim 1, wherein said holding means each has a function of amplifying a potential difference.

3. The semiconductor memory device according to claim 1, wherein said holding means each includes a latch circuit.

4. The semiconductor memory device according to claim 1, wherein said disconnecting means each includes a transistor provided between each of said holding means and bit lines constituting each of said bit line pairs, said transistor being turned off in response to a predetermined signal.

5. The semiconductor memory device according to claim 4, further comprising refresh address generating means responsive to said predetermined signal for generating a refresh address, wherein said refreshing means refreshes a memory cell corresponding to said generated refresh address.

6. The semiconductor memory device according to claim 1, further comprising column selecting means for selecting one of the columns of said memory cells, wherein said outputting means outputs a potential difference held by the corresponding holding means in response to the selection output of said column selecting means.

7. The semiconductor memory device according to claim 1, further comprising:
    write instructing means for instructing a writing operation,
    re-connecting means responsive to the instruction output of said write instructing means for re-connecting said holding means and said bit line pairs, and
    writing means for writing the information charge based on the potential difference held by said holding means into a corresponding memory cell, with re-connection being established by said re-connecting means.

8. The semiconductor memory device according to claim 7, wherein said writing means amplifies the potential differences held by said holding means by using said amplifiers.

9. The semiconductor memory device according to claim 7, wherein said holding means has a function of amplifying the held potential difference and said writing means performs a writing operation based on the potential difference amplified by said holding means.

10. The semiconductor memory device according to claim 7, further comprising:
row address designating means for designating a row address,
row address holding means for holding said designated row address, wherein
said reading means selects one of said word lines based on said designated row address and said writing means writes information charge to a memory cell corresponding to said held row address.

11. A semiconductor memory device enabling a page mode operation comprising:
a plurality of memory cells each for storing information charge arranged in a matrix of rows and columns,
a plurality of bit line pairs each provided corresponding to each of the rows of said memory cells and connected to the memory cells in the corresponding rows,
a plurality of word lines each provided corresponding to each of the columns of said memory cells in a direction crossing said bit line pairs and connected to the corresponding memory cells,
reading means for selecting one of said word lines to read the information charge of each memory cell connected to the selected word line onto one of the bit lines of each of said bit line pairs,
a plurality of sense amplifiers each provided corresponding to each of said bit line pairs for amplifying a potential difference appearing between the bit lines of each of said bit line pairs when said reading means reads the information charge of each memory cell,
a plurality of holding means each provided corresponding to each of said bit line pairs, to be connected to the corresponding bit line to hold said amplified potential difference between the bit lines of each bit line pair,
a plurality of disconnecting means for disconnecting said holding means from said bit line pairs with each of said holding means holding the potential difference of the corresponding bit line pair,
refreshing means for refreshing said memory cells with said disconnecting means being activated,
page mode read instructing means for instructing a reading operation of a page mode, and
outputting means for sequentially outputting the potential difference corresponding to each of said bit line pairs held by said holding means in the order designated by said page mode read instructing means.

12. The semiconductor memory device according to claim 11, wherein said holding means has a function of amplifying a potential difference.

13. The semiconductor memory device according to claim 11, wherein said holding means includes a latch circuit.

14. The semiconductor memory device according to claim 11, wherein said disconnecting means each includes a transistor provided between said holding means and bit lines constituting each of said bit line pairs, each of said transistors turning off in response to a predetermined signal.

15. The semiconductor memory device according to claim 11, further comprising:
write instructing means for instructing a writing operation,
re-connecting means responsive to the output of the instruction of said write instructing means for re-connecting said holing means said bit line pairs, and
writing means for writing the information charge based on the potential difference held by said holding means into the memory cells connected to said selected word line with the re-connection being established by said re-connecting means.

16. The semiconductor memory device according to claim 11, further comprising:
page mode write instructing means for instructing a writing operation of a page mode,
data applying means responsive to the output of the instruction of said page mode write instructing means for applying data to be written to each of the memory cells connected to said selected word line,
potential difference rewriting means for rewriting the potential difference held by said holding means to a potential difference based on said applied data,
re-connecting means for re-connecting said holding means and said bit line pairs after the completion of the operation of said potential difference rewriting means, and
writing means for writing the information charge based on the potential difference held by said holding means in all the memory cells connected to said selected word line with the re-connection established by said re-connecting means.

17. A semiconductor memory device comprising:
a plurality of memory cells each for storing information charge,
a bit line pair connected to each of said memory cells,
a plurality of word lines each connected to each of said memory cells in a direction crossing said bit line pair,
precharge means connected to one end portion of said bit line pair for precharging the potential on said bit line pair to a predetermined potential,
a sense amplifier provided between said precharge means and one end portion of said bit line pair for amplifying the potential difference appearing between the bit lines of said bit line pair when the information charge of each of said memory cells is read,
an input/output line connected to the other end portion of said bit line pair for externally outputting the potential difference amplified by said sense amplifier or transmitting an externally applied potential to each of the bit lines of said bit line pair,
holding means provided between said input/output line and the other end portion of said bit line pair for holding said amplified potential difference, and
disconnecting means provided on the bit lines of said bit line pair and between the portion to which said memory cell is connected and said holding means for electrically disconnecting said holding means from said bit line pair.

18. The semiconductor memory device according to claim 17, wherein said holding means has a function of amplifying a potential difference.

19. The semiconductor memory device according to claim 17, wherein said holding means includes a latch circuit.

20. A method of reading data to be refreshed of a semiconductor memory device comprising the steps of:
selecting one of word lines to read information of memory cells connected to the selected word line,
holding said read information for each bit line pair,
sequentially reading said held information, and
refreshing a memory cell array in parallel with said reading step.

21. The method of reading the data according to claim 20, wherein said information holding step includes the steps of:
holding said read information in a holding portion connected to each of the bit line pairs, and
electrically disconnecting said holding portion from the memory cell array.

* * * * *